United States Patent
Pan et al.

(10) Patent No.: US 12,104,277 B2
(45) Date of Patent: Oct. 1, 2024

(54) NONLINEAR OPTICAL CRYSTAL OF BARIUM CESIUM BORATE, PREPARATION METHOD AND USE THEREOF

(71) Applicant: XINJIANG TECHNICAL INSTITUTE OF PHYSICS & CHEMISTRY, CHINESE ACADEMY OF SCIENCES, Urumqi (CN)

(72) Inventors: Shilie Pan, Urumqi (CN); Zhaohong Miao, Urumqi (CN); Yun Yang, Urumqi (CN)

(73) Assignee: XINJIANG TECHNICAL INSTITUTE OF PHYSICS & CHEMISTRY. CHINESE ACADEMY OF SCIENCES, Urumqi (CN)

( * ) Notice: Subject to any disclaimer, the term of this patent is extended or adjusted under 35 U.S.C. 154(b) by 477 days.

(21) Appl. No.: 17/634,955

(22) PCT Filed: Jun. 30, 2020

(86) PCT No.: PCT/CN2020/099203
§ 371 (c)(1),
(2) Date: Feb. 11, 2022

(87) PCT Pub. No.: WO2021/057151
PCT Pub. Date: Apr. 1, 2021

(65) Prior Publication Data
US 2022/0290326 A1     Sep. 15, 2022

(30) Foreign Application Priority Data
Sep. 23, 2019 (CN) .......................... 201910898375.7

(51) Int. Cl.
*C30B 9/12*     (2006.01)
*C30B 29/22*    (2006.01)
(Continued)

(52) U.S. Cl.
CPC ............... *C30B 29/22* (2013.01); *C30B 9/12* (2013.01); *G02F 1/3551* (2013.01); *G02F 1/39* (2013.01)

(58) Field of Classification Search
CPC ... C30B 9/12; C30B 29/22; G02F 1/39; G02F 1/3551
See application file for complete search history.

(56) References Cited

U.S. PATENT DOCUMENTS 6,391,229 B1    5/2002    Watanabe et al.

FOREIGN PATENT DOCUMENTS

| | | |
|---|---|---|
| CN | 101245490 A | 8/2008 |
| CN | 102337586 A | 2/2012 |

(Continued)

OTHER PUBLICATIONS

Guojun Chen, et al., Synthesis and crystal structure of a new cesium barium borate, CsBaB3O6, Journal of Solid State Chemistry, 2007, pp. 2194-2201, vol. 180.

*Primary Examiner* — Bijan Ahvazi
(74) *Attorney, Agent, or Firm* — Bayramoglu Law Offices LLC

(57) ABSTRACT

A nonlinear optical crystal of barium cesium borate, a preparation method and use thereof are provided. The nonlinear optical crystal has a chemical formula of $CsBa_3B_{11}O_{20}$ and a molecular weight of 983.84. The nonlinear optical crystal belongs to an orthorhombic crystal system; a space group of the nonlinear optical crystal is $Cmc2_1$; lattice parameters of the nonlinear optical crystal are a=19.011(7) Å, b=10.837(4) Å, c=8.578(3) Å, Z=4, V=1767.4(11) Å$^3$; and a Mohs hardness of the nonlinear optical crystal is 4-5. The nonlinear optical crystal is grown by a flux method. The nonlinear optical crystal of the barium cesium borate obtained is used for a manufacture of nonlinear optical devices. The nonlinear optical crystal has a (Continued)

large size of centimeter-scale at least and is prepared by fast, simple and low-cost operations. The nonlinear optical crystal prepared has a large size, a wide light transmission band and good mechanical properties.

3 Claims, 2 Drawing Sheets

(51) Int. Cl.
*G02F 1/355* (2006.01)
*G02F 1/39* (2006.01)

(56) References Cited

FOREIGN PATENT DOCUMENTS

| | | | | | |
|---|---|---|---|---|---|
| CN | 102942189 | A | | 2/2013 | |
| CN | 103588218 | A | | 2/2014 | |
| CN | 103590107 | A | | 2/2014 | |
| CN | 104562203 | A | | 4/2015 | |
| CN | 105986318 | A | | 10/2016 | |
| CN | 110468445 | A | * | 11/2019 | ............. C30B 29/22 |
| EP | 0693581 | A1 | | 1/1996 | |
| IN | 102534784 | A | | 7/2012 | |
| JP | 2000256096 | A | | 9/2000 | |

\* cited by examiner

NONLINEAR OPTICAL CRYSTAL OF BARIUM CESIUM BORATE, PREPARATION METHOD AND USE THEREOF

CROSS REFERENCE TO THE RELATED APPLICATIONS

This application is the national stage entry of International Application No. PCT/CN2020/099203, filed on Jun. 30, 2020, which is based upon and claims priority to Chinese Patent Application No. 201910898375.7, filed on Sep. 23, 2019, the entire contents of which are incorporated herein by reference.

TECHNICAL FIELD

The invention relates to a nonlinear optical crystal of cesium barium borate and a preparation method and use thereof.

BACKGROUND

At present, the main nonlinear optical materials used in frequency conversion of ultraviolet and deep-ultraviolet bands include: BBO (β-BBO), LBO (LiB$_3$O$_5$) crystal, CBO (CsB$_3$O$_5$) crystal, CLBO (CsLiB$_6$O$_{10}$) crystal, SBBO (Sr$_2$B$_2$Be$_2$O$_7$) and KABO (K$_2$Al$_2$B$_2$O$_7$) and KBBF (KBe$_2$BO$_3$F$_2$) crystals. Although the crystal growth technology of these materials has been maturing gradually day by day, there are still obvious shortcomings. For example, the crystal deliquesces easily; the growth cycle is long; the layered growth habit is severe; and the price is high; etc. Therefore, it is still a very important and arduous task to search for new nonlinear optical crystal materials.

In order to output light in ultraviolet and deep-ultraviolet wavelengths, all-solid-state lasers must rely on nonlinear optical crystals and it must be generated by means of harmonics. Therefore, ultraviolet and deep-ultraviolet nonlinear optical crystals are key components in ultraviolet and deep-ultraviolet all-solid-state lasers. The optical performance of this type of crystals determines the wavelength and optical quality of the coherent light output of this type of lasers.

Therefore, in recent years, for developing new nonlinear optical crystals, not only the optical and mechanical properties of the crystals, but also the preparation characteristics of the crystals have been paid more and more attention. It is hoped that the new crystal material can be easily prepared, so that low-cost, large-size and high-quality nonlinear optical crystals can be obtained.

SUMMARY

The purpose of the present invention is to satisfy the needs for the nonlinear optical materials used in all solid-state ultraviolet/deep-ultraviolet laser systems. The present invention provides a nonlinear optical crystal of barium cesium borate. The crystal has a chemical formula of Cs$_3$Ba$_3$B$_{11}$O$_{20}$ and a molecular weight of 983.84. It belongs to orthorhombic crystal system; its space group is Cmc2$_1$; its lattice parameters are a=19.011(7) Å, b=10.837(4) Å, c=8.578(3) Å, Z=4, V=1767.4(11) Å$^3$; and its Mohs hardness is 4-5. The crystal is grown by a flux method. The nonlinear optical crystal of cesium barium borate obtained by such a method is used for the manufacture of non-linear optical devices. The crystal has a large size of centimeter-scale at least and can be prepared by fast, simple and low-cost operations. The crystal prepared thereby has a large size, a wide light transmission band and good mechanical properties; it is not frangible; has stable physical and chemical properties; can be easily processed, etc.

The nonlinear optical crystal of barium cesium borate according to the present invention has a chemical formula of CsBa$_3$B$_{11}$O$_{20}$ and a molecular weight of 983.84. It belongs to orthorhombic crystal system; its space group is Cmc2$_1$; its lattice parameters are a=19.011(7) Å, b=10.837(4) Å, c=8.578(3) Å, Z=4, V=1767.4(11) Å$^3$; and its Mohs hardness is 4-5.

The method for preparing said nonlinear optical crystal of barium cesium borate utilizes a compound flux method to grow the crystal, and has specific operation steps as follows:

a. placing and mixing barium-containing compound BaO, BaCO$_3$, Ba(NO$_3$)$_2$, BaC$_2$O$_4$, Ba(OH)$_2$, Ba(C$_2$H3O$_2$)$_2$, BaF$_2$ or BaCl$_2$; cesium-containing compound Cs$_2$O, Cs$_2$CO$_3$, CsNO$_3$, Cs$_2$C$_2$O$_4$·nH$_2$O, CsOH, CsC$_2$H$_3$O$_2$, CsF or CsCl; boron-containing compound H$_3$BO$_3$ or B$_2$O$_3$ in a mortar, grinding the compound mixture thoroughly and transferring it into an open corundum crucible with Φ100 mm×100 mm, pressing the compound mixture firmly and placing it into a muffle furnace, raising the temperature slowly to 450° C. and holding at said temperature for 5 hours, discharging the gas as much as possible, taking out the crucible after cooling down, taking out the sample and re-grinding it evenly, then putting it in the crucible again, keeping it in the muffle furnace at a temperature of 750° C. for 48 hours before taking it out then mashing and grinding it in a mortar to obtain cesium barium borate compound CsBa$_3$B$_{11}$O$_{20}$, then conducting X-ray analysis on the compound, wherein the X-ray spectrum obtained as above is consistent with that of the finished product CsBa$_3$B$_{11}$O$_{20}$ single crystal after being grinded into powder;

b. adding the compound cesium barium borate obtained in step a to a flux at a molar ratio of 1:0.5-3, heating up the mixture to a temperature of 700-750° C. and holding at the temperature for 10-100 h before cooling down to 680-618° C. to obtain a mixed melt of cesium barium borate and the flux, wherein the flux is PbO, PbCO$_3$, Pb(NO$_3$)$_2$, PbC$_2$O$_4$, Pb(OH)$_2$, Pb(C$_2$H$_3$O$_2$)$_2$·3H$_2$O or Cs$_2$O:

c. crystallizing by slowly cooling down to room temperature at a rate of 0.5-5° C./h to obtain seed crystals, or using platinum wire suspension method during the cooling process to obtain small crystals as seed crystals;

then growing crystals on the surface of or inside the mixed melt of cesium barium borate and the flux:

d. feeding the seed crystal fixed on a seed rod from the top of the crystal growth furnace to make the seed crystal contact with the surface of the mixed melt of cesium barium borate and the flux or extend into the melt of cesium barium borate and the flux, reducing the temperature to 618-660° C., and rotating the seed rod at a speed of 0-100 rpm;

e. separating the crystal from the surface of melt after the crystal grows into the required size, and cooling down to room temperature at a rate of 1-100° C./h, then taking the crystal out of the furnace slowly to obtain the nonlinear optical crystal of barium cesium borate.

The nonlinear optical crystal of barium cesium borate is used in the manufacture of a frequency multiplication generator, a frequency up converter, a frequency down converter or an optical parametric oscillator.

Said frequency multiplication generator, frequency up converter, frequency down converter or optical parametric oscillator contains a device in which at least one beam of input electromagnetic radiation passes through at least one nonlinear optical crystal and then generates at least one beam of output radiation with a frequency different from that of the incident electromagnetic radiation.

The nonlinear optical crystal of barium cesium borate according to the present invention provides a method for preparing a nonlinear optical crystal of barium cesium borate using a flux method during the preparation process, wherein a compound cesium barium borate, as the raw material, is added to a flux for crystal growth. The crystal obtained by this method has a large size of centimeter-scale at least and can be prepared by fast, simple and low-cost operations. The crystal prepared thereby has a large size, a wide light transmission band and good mechanical properties; it is not frangible; has stable physical and chemical properties; and can be easily processed, etc. it is suitable for the requirement of laser frequency conversion in the ultraviolet band, and can be used to manufacture nonlinear optical devices.

In principle, general chemical synthesis methods can be used in the present invention to prepare cesium barium borate ($CsBa_3B_{11}O_{20}$) polycrystalline raw materials. Preferably a solid-phase reaction method is used, in which compounds containing Cs, Ba and B, as raw materials, are mixed in a molar ratio of 1:3:11 thoroughly and heated for solid-phase reaction; then a compound with a chemical formula of $CsBa_3B_{11}O_{20}$ can be obtained.

The chemical reaction formulas for preparing cesium barium borate ($CsBa_3B_{11}O_{20}$) compound are shown as follows:

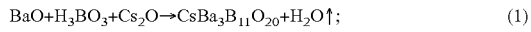  (1)

  (2)

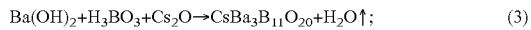  (3)

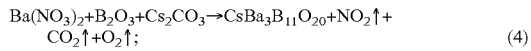  (4)

  (5)

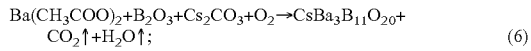  (6)

  (7)

In the present invention, the Cs-containing, Ba-containing and B-containing compounds can be commercially available reagents and raw materials.

The large-size nonlinear optical crystal of barium cesium borate $CsBa_3B_{11}O_{20}$ according to the present invention is used for manufacturing nonlinear optical devices, including a frequency multiplication generator, a frequency up or down converter and an optical parametric oscillator.

The nonlinear device manufactured b the nonlinear optical crystal of barium cesium borate ($CsBa_3B_{11}O_{20}$) includes the coherent light which will cause at least one incident fundamental wave light to generate at least one incident light with a frequency different from that of incident fundamental one. The nonlinear optical crystal of barium cesium borate ($CsBa_3B_{11}O_{20}$) has no special requirements for optical processing accuracy.

Compared with the existing technology for preparing non-linear optical crystals applied to the frequency conversion in ultraviolet/deep ultraviolet light band, the preparation method of the present invention has many merits. For example, the crystal is easy to grow large and transparent without inclusions; operations are simple; growth speed is high; cost is low; and crystals in larger sizes are easily obtained, etc.

DETAILED DESCRIPTION OF THE EMBODIMENTS

Figure 1:
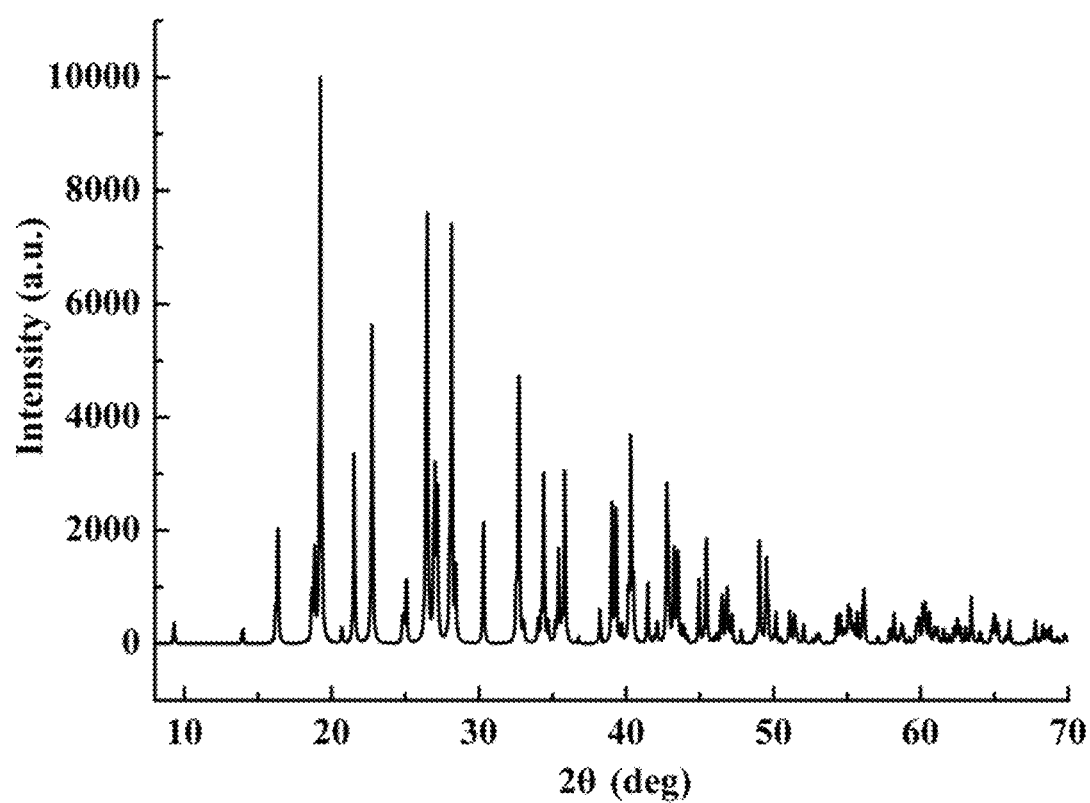
FIG. 1 is an X-ray diffraction spectrum of barium cesium borate powder according to the present invention.
Figure 2:
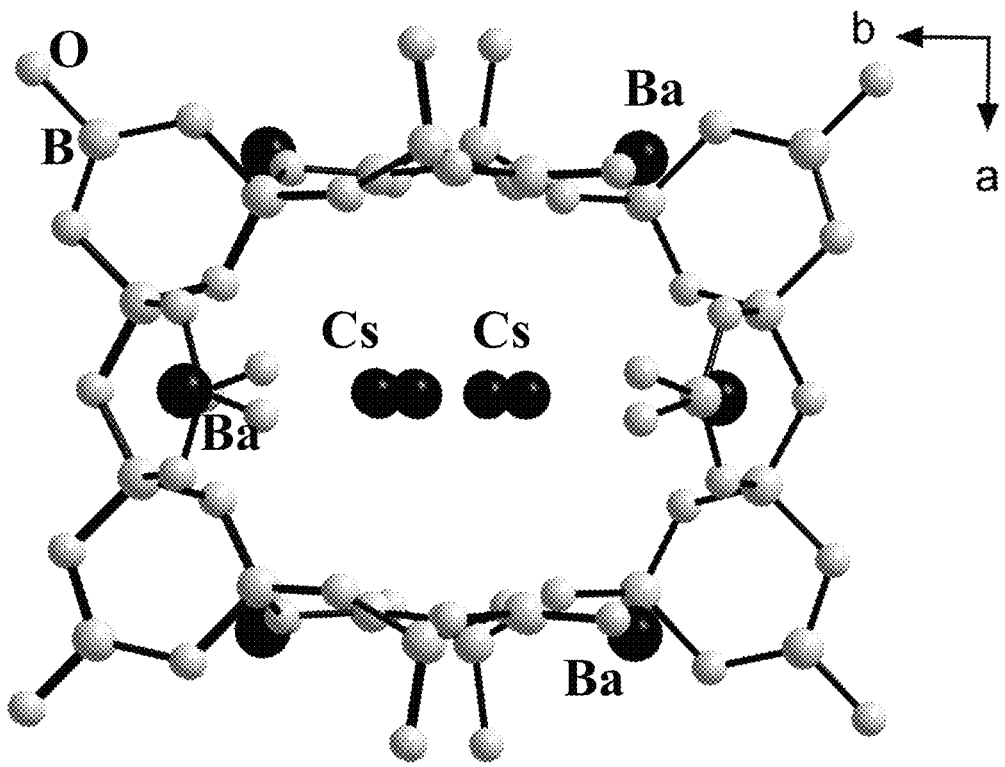
FIG. 2 is a structural diagram of barium cesium borate single crystal according to the present invention.

The present invention will be described in detail below with reference to the drawings and embodiments:

Example 1

Based on the chemical formula: $Ba(NO_3)_2+H_3BO_3+Cs_2CO_3 \rightarrow CsBa_3B_{11}O_{20}+NO_2\uparrow+CO_2\uparrow+O_2\uparrow$, compound $CsBa_3B_{11}O_{20}$ was synthesized using a solid-state synthesis method shown as follows.

$Ba(NO_3)_2$, $Cs_2CO_3$, and $H_3BO_3$ were placed in a mortar at a molar ratio of 6:1:22, mixed and grinded thoroughly, then transferred into an open corundum crucible with Φ100 mm×100 mm.

The mixture was pressed firmly, and placed into a muffle furnace. The temperature was raised up slowly to 450° C. and held at this temperature for 5 hours. Gas was discharged as much as possible; and the crucible was taken out after cooled down. The sample was taken out, re-grinded evenly, placed in the crucible, and kept in the muffle furnace at a temperature of 750° C. for 48 hours before being taken out then mashed and grinded in a mortar to obtain cesium barium borate compound $CsBa_3B_{11}O_{20}$. X-ray analysis was then conducted on the compound. The X-ray spectrum obtained as above is consistent with that of the finished product $CsBa_3B_{11}O_{20}$ single crystal after grinded into powder.

The obtained compound cesium barium borate was add to flux PbO at a molar ratio of 1:3. The mixture was heated to a temperature of 700° C. and kept at such a temperature for 30 h before cooled down to 680° C. to obtain a mixed melt of cesium barium borate and the flux.

Crystallization was conducted by slowly cooling down to room temperature at a rate of 0.5° C./h to obtain seed crystals.

The seed crystal fixed on the seed rod was fed from the top of the crystal growth furnace to make the seed crystal contact with the surface of the mixed melt of cesium barium borate and the flux.

The temperature was reduced to 660° C., and the seed rod was rotated at a speed of 70 rpm.

After growing into the required size, the crystal was separated from the surface of the melt. The temperature was reduced to room temperature at a rate of 80° C./h, then the crystal was taken out of the furnace to obtain the nonlinear optical crystal of barium cesium borate in a size of 30 mm×30 mm×10 mm.

According to the method described in Example 1, the reaction formula $BaO+B_2O_3+Cs_2O+O_2 \rightarrow CsBa_3B_{11}O_{20}+Cl_2\uparrow+H_2O\uparrow$ was used to synthesize compound $CsBa_3B_{11}O_{20}$, and nonlinear optical crystal of cesium barium borate $CsBa_3B_{11}O_{20}$ was also obtained.

Example 2

Compound $CsBa_3B_{11}O_{20}$ was synthesized based on the reaction formula $Ba(OH)_2+H_3BO_3+CsOH \rightarrow CsBa_3B_{11}O_{20}+H_2O\uparrow$, wherein the molar ratio of each compound was in accordance with the molecular formula, and the detailed operation steps were carried out according to Example 1.

The synthesized compound $CsBa_3B_{11}O_{20}$ and flux $Cs_2O$ were placed, at a molar ratio of $CsBa_3B_{11}O_{20}:Cs_2O=1:0.5$, into an open platinum crucible with Φ100 mm×100 mm. The crucible was put into a crystal growth furnace, heated to 750° C., and kept at such a temperature for 20 hours before cooled down to 672° C. As a result, a mixed melt of barium cesium borate and the flux was obtained.

The temperature was decreased slowly at a rate of 1° C./h, and during this cooling process, a platinum wire suspension method was utilized to obtain small crystals, i.e., seed crystals.

The $CsBa_3B_{11}O_{20}$ seed crystal cut along the c-axis was fixed to the lower end of a seed rod with platinum wire, and introduced into the crucible through the small hole on the top of the furnace, so that the seed crystal was in contact with the liquid surface of the mixed melt. The temperature was reduced to 650° C., and the seed rod was rotated at a speed of 30 rpm.

After growing into the required size, the crystal was separated from the surface of the melt. The temperature was reduced to room temperature at a rate of 40° C./h, then the crystal was taken out of the furnace to obtain the nonlinear optical crystal of barium cesium borate $CsBa_3B_{11}O_{20}$ in a size of 70 mm×70 mm×15 mm.

According to the method described in Example 2, the reaction formula $Cs_2CO_3+B_2O_3+BaCO_3 \rightarrow CsBa_3B_{11}O_{20}+CO_2\uparrow$ was used to synthesize compound $CsBa_3B_{11}O_{20}$, and nonlinear optical crystal of $CsBa_3B_{11}O_{20}$ was also obtained.

Example 3

Compound $CsBa_3B_{11}O_{20}$ was synthesized based on the reaction formula $BaC_2O_4+H_3BO_3+Cs_2C_2O_4 \cdot nH_2O+O_2 \rightarrow CsBa_3B_{11}O_{20}+CO_2\uparrow+H_2O\uparrow$, wherein the molar ratio of each compound was in accordance with the molecular formula, and the detailed operation steps were carried out according to Example 1.

The synthesized compound $CsBa_3B_{11}O_{20}$ and the flux CsOH were placed, at a molar ratio of $CsBa_3B_{11}O_{20}:CsOH=1:1.5$, into an open platinum crucible with Φ80 mm×80 mm. The crucible was put into a crystal growth furnace, heated to 740° C., and kept at such a temperature for 10 hours before cooled down to 650° C. As a result, a mixed melt of barium cesium borate and the flux was obtained.

Crystallization was conducted by slowly cooling down to room temperature at a rate of 2.5° C./h to obtain seed crystals.

The $CsBa_3B_{11}O_{20}$ seed crystal cut along any axis was fixed to the lower end of the seed rod with platinum wire, and introduced into the crucible through the small hole on the top of the furnace, so that the seed crystal was in contact with the liquid surface of the mixed melt. The temperature was reduced to 630° C., and the seed rod was rotated at a speed of 90 rpm.

After growing into the required size, the crystal was lifted away from the surface of the melt. The temperature was reduced to room temperature at a rate of 100° C./h, then the crystal was taken out of the furnace slowly to obtain the nonlinear optical crystal of barium cesium borate in a size of Φ32 mm×32 mm×25 mm.

According to the method described in Example 3, the reaction formula $BaO+H_3BO_3+Cs_2O \rightarrow CsBa_3B_{11}O_{20}+H_2O\uparrow$ was used to synthesize compound $CsBa_3B_{11}O_{20}$, and nonlinear optical crystal of cesium barium borate $CsBa_3B_{11}O_{20}$ was also obtained.

Example 4

Compound $CsBa_3B_{11}O_{20}$ was synthesized based on the reaction formula $Ba(OH)_2+H_3BO_3+CsOH \rightarrow CsBa_3B_{11}O_{20}+H_2O\uparrow$, wherein the molar ratio of each compound was in accordance with the molecular formula, and the detailed operation steps were carried out according to Example 1.

The synthesized compound $CsBa_3B_{11}O_{20}$ and the flux $Cs_2CO_3$ were placed, at a molar ratio of $CsBa_3B_{11}O_{20}:Cs_2CO_3=1:2.6$, into an open platinum crucible with Φ100 mm×100 mm. The crucible was put into a crystal growth furnace, heated to 720° C. and kept at such a temperature for 40 hours before cooled down to 640° C. As a result, a mixed melt of barium cesium borate and the flux was obtained.

Crystallization was conducted by slowly cooling down to room temperature at a rate of 3° C./h to obtain seed crystals.

The $CsBa_3B_{11}O_{20}$ seed crystal cut along any axis was fixed to the lower end of the seed rod with platinum wire, and introduced into the crucible through the small hole on the top of the furnace, so that the seed crystal was immersed in the mixed melt. The temperature was reduced to 618° C., and the seed rod was not rotated at a speed of 0 rpm.

After growing into the required size, the crystal was separated from the surface of the melt. The temperature was reduced to room temperature at a rate of 60° C./h, then the crystal was taken out of the furnace slowly to obtain the nonlinear optical crystal of barium cesium borate $CsBa_3B_{11}O_{20}$ in a size of Φ37 mm×37 mm×15 mm.

According to the method described in Example 4, the reaction formula $Ba(NO_3)_2+B_2O_3+CsNO_3 \rightarrow CsBa_3B_{11}O_{20}+NO_2\uparrow+O_2\uparrow$ was used to synthesize compound $CsBa_3B_{11}O_{20}$, and nonlinear optical crystal of cesium barium borate $CsBa_3B_{11}O_{20}$ can also be obtained.

Example 5

Compound $CsBa_3B_{11}O_{20}$ was synthesized based on the reaction formula $BaCO_3+B_2O_3+Cs_2O \rightarrow CsBa_3B_{11}O_{20}+CO_2\uparrow$, wherein the molar ratio of each compound was in accordance with the molecular formula, and the detailed operation steps were carried out according to Example 1.

The synthesized compound $CsBa_3B_{11}O_{20}$ and the flux $Cs_2CO_3$ were placed, at a molar ratio of $CsBa_3B_{11}O_{20}:Cs_2CO_3=1:2$, into an open platinum crucible with Φ100 mm×100 mm. The crucible was put into a crystal growth furnace, heated to 735° C., and kept at such a temperature for 60 hours before cooled down to 655° C. As a result, a mixed melt of barium cesium borate and the flux was obtained.

The temperature was decreased slowly at a rate of 4° C./h, and during this cooling process, a platinum wire suspension method was utilized to obtain small crystals, i.e., seed crystals.

The $CsBa_3B_{11}O_{20}$ seed crystal cut along any axis was fixed to the lower end of the seed rod with platinum wire, and introduced into the crucible through the small hole on the top of the furnace, so that the seed crystal was immersed in the mixed melt. The temperature was reduced to 625° C., and the seed rod was rotated at a speed of 55 rpm.

After growing into the required size, the crystal was separated from the surface of melt. The temperature was reduced to room temperature at a rate of 70° C./h, then the crystal was taken out of the furnace slowly to obtain the nonlinear optical crystal of barium cesium borate $CsBa_3B_{11}O_{20}$ in a size of 17 mm×17 mm×18 mm.

According to the method described in Example 5, the reaction formula $BaC_2O_4+H_3BO_3+Cs_2C_2O_4 \cdot nH_2O+O_2 \rightarrow CsBa_3B_{11}O_{20}+CO_2\uparrow+H_2O\uparrow$ was used to synthesize $CsBa_3B_{11}O_{20}$ compound, and nonlinear optical crystal of cesium barium borate $CsBa_3B_{11}O_{20}$ was also obtained.

Example 6

Compound $CsBa_3B_{11}O_{20}$ was synthesized based on the reaction formula $BaCl_2+B_2O_3+CsOH+O_2 \rightarrow CsBa_3B_{11}O_{20}+Cl_2\uparrow+H_2O\uparrow$, wherein the molar ratio of each compound was in accordance with the molecular formula, and the detailed operation steps were carried out according to Example 1.

The synthesized compound $CsBa_3B_{11}O_{20}$ and the flux $Pb(OH)_2$ were placed, at a molar ratio of $CsBa_3B_{11}O_{20}:Pb(OH)_2=1:2.5$, into an open platinum crucible with $\Phi 100$ mm×100 mm, heated to 710° C., and kept at such a temperature for 100 hours before cooled down to 645° C. As a result, a mixed melt of barium cesium borate and the flux was obtained.

Crystallization was conducted by slowly cooling down to room temperature at a rate of 5° C./h to obtain seed crystals.

The $CsBa_3B_{11}O_{20}$ seed crystal cut along the c-axis was fixed to the lower end of the seed rod with platinum wire, and introduced into the crucible through the small hole on the top of the furnace, so that the seed crystal was immersed in the mixed melt. The temperature was reduced to 632° C., and the seed rod was rotated at a speed of 60 rpm.

After the growth was completed, the crystal was separated from the surface of melt. The temperature was reduced to room temperature at a rate of 20° C./h, then the transparent nonlinear optical crystal of barium cesium borate $CsBa_3B_{11}O_{20}$ in a size of 50 mm×70 mm×15 mm was obtained.

According to the method described in Example 6, the reaction formula $BaC_2O_4+H_3BO_3+Cs_2C_2O_4 \cdot nH_2O+O_2 \rightarrow CsBa_3B_{11}O_{20}+CO_2\uparrow+H_2O\uparrow$ was used to synthesize $CsBa_3B_{11}O_{20}$ compound, and nonlinear optical crystal of $CsBa_3B_{11}O_{20}$ was also obtained.

Example 7

Compound $CsBa_3B_{11}O_{20}$ was synthesized based on the reaction formula $BaCO_3+B_2O_3+Cs_2O \rightarrow CsBa_3B_{11}O_{20}+CO_2\uparrow$, wherein the molar ratio of each compound was in accordance with the molecular formula, and the detailed operation steps were carried out according to Example 1.

The synthesized compound $CsBa_3B_{11}O_{20}$ and the flux PbO were placed, at a molar ratio of $CsBa_3B_{11}O_{20}:PbO=1:2.8$, into an open platinum crucible with $\Phi 100$ mm×100 mm, heated to 700° C., and kept at such a temperature for 70 hours before cooled down to 670° C. As a result, a mixed melt of barium cesium borate and the flux was obtained.

The temperature was decreased slowly at a rate of 1.5° C./h, and during this cooling process, a platinum wire suspension method was utilized to obtain small crystals, i.e., seed crystals.

The $CsBa_3B_{11}O_{20}$ seed crystal cut along any axis was fixed to the lower end of the seed rod with platinum wire, and introduced into the crucible through the small hole on the top of the furnace, so that the seed crystal was in contact with the liquid surface of the mixed melt. The temperature was reduced to 635° C., and the seed rod was rotated at a speed of 85 rpm.

After growth was completed, the crystal was separated from the surface of melt. The temperature was reduced to room temperature at a rate of 10° C./h, then the transparent nonlinear optical crystal of barium cesium borate $CsBa_3B_{11}O_{20}$ in a size of 50 mm×50 mm×14 mm was obtained.

According to the method described in Example 7, the reaction formula $BaO+B_2O_3+Cs_2O \rightarrow CsBa_3B_{11}O_{20}+H_2O\uparrow$ was used to synthesize $CsBa_3B_{11}O_{20}$ compound, and nonlinear optical crystal of $CsBa_3B_{11}O_{20}$ was also obtained.

Example 8

Compound $CsBa_3B_{11}O_{20}$ was synthesized based on the reaction formula $Ba(NO_3)_2+B_2O_3+CsNO_3 \rightarrow CsBa_3B_{11}O_{20}+NO_2\uparrow+O_2\uparrow$, wherein the molar ratio of each compound was in accordance with the molecular formula, and the detailed operation steps were carried out according to Example 1.

The synthesized compound $CsBa_3B_{11}O_{20}$ and the flux $PbF_2$ were placed, at a molar ratio of $CsBa_3B_{11}O_{20}:PbF_2=1:3$, into an open platinum crucible with $\Phi 150$ mm×150 mm, heated to 715° C., and kept at such a temperature for 50 hours before cooled down to 630° C. As a result, a mixed melt of barium cesium borate and the flux was obtained.

Crystallization was conducted by slowly cooling down to room temperature at a rate of 3.5° C./h to obtain seed crystals.

The $CsBa_3B_{11}O_{20}$ seed crystal cut along any axis was fixed to the lower end of the seed rod with platinum wire, and introduced into the crucible through the small hole on the top of the furnace, so that the seed crystal was in contact with the liquid surface of the mixed melt. The temperature was reduced to 620° C., and the seed rod was rotated at a speed of 100 rpm.

After growth was completed, the crystal was separated from the surface of melt. The temperature was reduced to room temperature at a rate of 1° C./h, then the transparent nonlinear optical crystal of barium cesium borate $CsBa_3B_{11}O_{20}$ in a size of 70 mm×70 mm×20 mm was obtained.

According to the method described in Example 8, the reaction formula $Ba(CH_3COO)_2+B_2O_3+Cs_2CO_3+O_2 \rightarrow CsBa_3B_{11}O_{20}+CO_2\uparrow+H_2O\uparrow$ was used to synthesize $CsBa_3B_{11}O_{20}$ compound, and nonlinear optical crystal of $CsBa_3B_{11}O_{20}$ was also obtained.

Example 9

Figure 3:
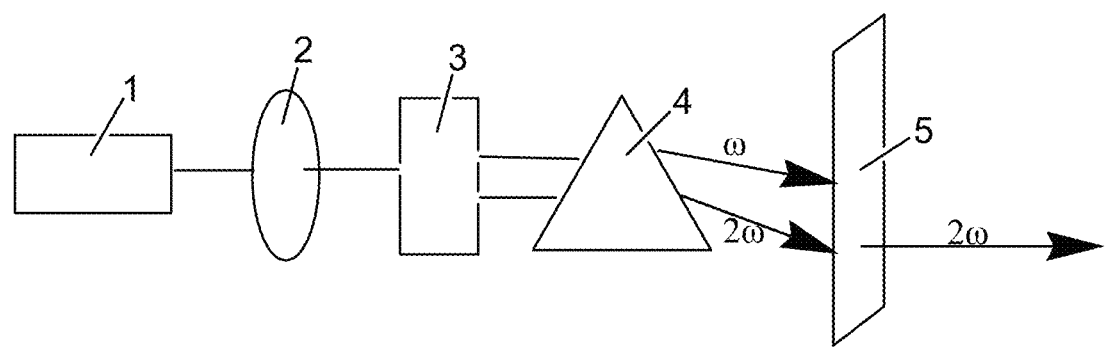
FIG. 3 is a functional diagram of a nonlinear optical device manufactured using the cesium barium borate crystal of the present invention, in which: 1 represents a laser; 2 represents an emission light beam; 3 represents a $CsBa_3B_{11}O_{20}$ crystal; 4 represents an emergent light beam; and 5 represents a filter.

Any one of the nonlinear optical crystals of $CsBa_3B_{11}O_{20}$ obtained in Examples 1-8 was processed in a matching direction to manufacture a frequency multiplier device with a size of 4 mm×4 mm×8 mm, and placed in position 3 as shown in FIG. 3. At room temperature, a Q-switched Nd:YAG laser was used as the light source; and the incident wavelength was 1064 nm. An infrared light beam 2 with a wavelength of 1064 nm was emitted from the Q-switched Nd:YAG laser 1 and entered the $CsBa_3B_{11}O_{20}$ crystal 3 to generate a green frequency doubled light with a wavelength of 532 nm, and the emergent light beam 4 contained the infrared light with a wavelength of 1064 nm and the green light with a wavelength of 532 nm. Through the filter 5, the infrared light component was removed and a green laser with a wavelength of 532 nm was obtained.

Finally, it should be noted that the above embodiments are only used to illustrate the technical solutions of the present invention and not to limit them. Although the present invention has been described in detail with reference to the embodiments, those skilled in the art should understand that modifications or equivalent substitutions to the technical solutions of the present invention do not depart from the spirit and scope of the technical solutions of the present invention, and should be covered within the scope of the claims of the present invention.

What is claimed is:

1. A nonlinear optical crystal of barium cesium borate, wherein the nonlinear optical crystal has a chemical formula of $CsBa_3B_{11}O_{20}$ and a molecular weight of 983.84, the nonlinear optical crystal belongs to an orthorhombic crystal system, a space group of the nonlinear optical crystal is $Cmc2_1$, lattice parameters of the nonlinear optical crystal are a=19.011(7) Å, b=10.837(4) Å, c=8.578(3) Å, Z=4, V=1767.4(11) Å$^3$, and a Mohs hardness of the nonlinear optical crystal is 4-5.

2. A method for preparing the nonlinear optical crystal of the barium cesium borate according to claim 1, wherein the nonlinear optical crystal is grown using a compound flux method with specific operation steps of:
   a. placing and mixing a barium-containing compound selected from the group consisting of $BaO$, $BaCO_3$, $Ba(NO_3)_2$, $BaC_2O_4$, $Ba(OH)_2$, $Ba(C_2H3O_2)_2$, $BaF_2$, and $BaCl_2$; a cesium-containing compound selected from the group consisting of $Cs_2O$, $Cs_2CO_3$, $CsNO_3$, $Cs_2C_2O_4 \cdot nH_2O$, $CsOH$, $CsC_2H_3O_2$, $CsF$, and $CsCl$; and a boron-containing compound selected from the group consisting of $H_3BO_3$ and $B_2O_3$ in a mortar to obtain a first compound mixture, grinding the first compound mixture thoroughly and transferring the first compound mixture into an open corundum crucible with Φ100 mm×100 mm, pressing the first compound mixture firmly and placing the first compound mixture into a muffle furnace, raising a temperature slowly to 450° C. and holding at the temperature of 450° C. for 5 hours, discharging a gas as much as possible, taking out the open corundum crucible after cooling down, taking out the first compound mixture and re-grinding the first compound mixture evenly, then putting the first compound mixture in the open corundum crucible again, keeping the first compound mixture in the muffle furnace at a temperature of 750° C. for 48 hours before taking the first compound mixture out then mashing and grinding the first compound mixture in the mortar to obtain a barium cesium borate compound $CsBa_3B_{11}O_{20}$, then conducting an X-ray analysis on the barium cesium borate compound, wherein an X-ray spectrum obtained as above is consistent with an X-ray spectrum of a finished product $CsBa_3B_{11}O_{20}$ single crystal after being grinded into a powder;
   b. adding the barium cesium borate compound obtained in step a to a flux at a molar ratio of 1:0.5-3 to obtain a second compound mixture, heating up the second compound mixture to a temperature of 700-750° C. and holding at the temperature of 700-750° C. for 10-100 hours before cooling down to 680-618° C. to obtain a mixed melt of barium cesium borate compound and the flux, wherein the flux is $PbO$, $PbCO_3$, $Pb(NO_3)_2$, $PbC_2O_4$, $Pb(OH)_2$, $Pb(C_2H_3O_2)_2 \cdot 3H_2O$, or $Cs_2O$;
   c. crystallizing by slowly cooling down to room temperature at a rate of 0.5-5° C./h to obtain seed crystals, or using a platinum wire suspension method during a cooling process to obtain crystals as the seed crystals; then growing the seed crystals on a surface of or inside the mixed melt of the cesium-barium cesium borate compound and the flux;
   d. feeding the seed crystals fixed on a seed rod from a top of a crystal growth furnace to make the seed crystals contact with the surface of the mixed melt of the barium cesium borate compound and the flux or extend into the mixed melt of the barium cesium borate compound and the flux, reducing the temperature to 618-660° C., and rotating the seed rod at a speed of 0-100 rpm;
   e. separating a crystal from the surface of the mixed melt after the crystal grows into a required size, and cooling down to room temperature at a rate of 1-100° C./h, then taking the crystal out of the crystal growth furnace slowly to obtain the nonlinear optical crystal of the barium cesium borate.

3. A method of using the nonlinear optical crystal of the barium cesium borate according to claim 1, comprising using the nonlinear optical crystal in a manufacture of a frequency multiplication generator, a frequency up converter, a frequency down converter, or an optical parametric oscillator.

* * * * *